United States Patent
Hirose

(10) Patent No.: US 8,981,893 B2
(45) Date of Patent: Mar. 17, 2015

(54) SEMICONDUCTOR CERAMIC AND RESISTIVE ELEMENT

(71) Applicant: Murata Manufacturing Co., Ltd., Nagaokakyo-shi, Kyoto-fu (JP)

(72) Inventor: Sakyo Hirose, Nagaokakyo (JP)

(73) Assignee: Murata Manufacturing Co., Ltd., Nagaokakyo-Shi, Kyoto-fu (JP)

(*) Notice: Subject to any disclaimer, the term of this patent is extended or adjusted under 35 U.S.C. 154(b) by 99 days.

(21) Appl. No.: 13/856,456

(22) Filed: Apr. 4, 2013

(65) Prior Publication Data

US 2013/0221475 A1 Aug. 29, 2013

Related U.S. Application Data

(63) Continuation of application No. PCT/JP2011/068850, filed on Aug. 22, 2011.

(30) Foreign Application Priority Data

Oct. 27, 2010 (JP) ................... 2010-240310

(51) Int. Cl.
*H01C 7/10* (2006.01)
*H01L 29/66* (2006.01)
*H01C 7/04* (2006.01)

(52) U.S. Cl.
CPC ........ *H01L 29/66* (2013.01); *H01C 7/04* (2013.01); *H01C 7/043* (2013.01)
USPC .......................................... 338/22 R; 338/13

(58) Field of Classification Search
USPC ........................................ 338/22 R
See application file for complete search history.

(56) References Cited

U.S. PATENT DOCUMENTS

| | | | |
|---|---|---|---|
| 5,292,716 A * | 3/1994 | Sakai et al. | 505/126 |
| 5,703,000 A * | 12/1997 | Nakayama et al. | 501/152 |
| 5,955,937 A * | 9/1999 | Groen | 338/22 SD |
| 7,944,337 B2 * | 5/2011 | Itoh et al. | 338/22 R |

(Continued)

FOREIGN PATENT DOCUMENTS

| | | |
|---|---|---|
| JP | 2001102204 A | 4/2001 |
| JP | 2002-044952 A | 2/2002 |

(Continued)

OTHER PUBLICATIONS

Nakajima, T.; "Development of new perovskite Mn oxides with ordered Site A and randomness effect"; ISSP Bulletin, Jul. 2005, vol. 45, 2nd Issue, pp. 8-12.

(Continued)

*Primary Examiner* — Kyung Lee
(74) *Attorney, Agent, or Firm* — Dickstein Shapiro LLP

(57) ABSTRACT

Provided is a resistive element which has excellent inrush current resistance, and can suppress heat generation in a steady state. The resistive element has an element main body of a semiconductor ceramic in which the main constituent has a structure of $R1_{1-x}R2_xBaMn_2O_6$ in which $0.05 \leq x \leq 1.0$ when R1 is Nd and R2 is at least one of Sm, Eu and Gd; $0.05 \leq x \leq 0.8$ when R1 is Nd and R2 is at least one of Tb, Dy, Ho, Er, and Y; $0 \leq x \leq 0.4$ when R1 is at least one of Sm, Eu, and Gd and R2 is at least one of Tb, Dy, Ho, and Y; and $0 \leq x \leq 1.0$ when R1 is at least one of Sm, Eu, and Gd and R2 is at least one of Sm, Eu, and Gd, but the Sm, Eu, and/or Gd in R1 is different from that in R2.

4 Claims, 3 Drawing Sheets

(56) References Cited

U.S. PATENT DOCUMENTS

| | | | |
|---|---|---|---|
| 8,362,869 B2 | 1/2013 | Poulain et al. | |
| 2004/0159825 A1 | 8/2004 | Chosokabe et al. | |
| 2004/0232893 A1 | 11/2004 | Odagawa et al. | |
| 2012/0200969 A1* | 8/2012 | Hirose | 361/93.7 |

FOREIGN PATENT DOCUMENTS

| | | |
|---|---|---|
| JP | 2004193572 A | 7/2004 |
| JP | 2005-199376 A | 7/2005 |
| JP | 3701302 B2 | 9/2005 |
| JP | 2007-099554 A | 4/2007 |
| WO | WO-2009080319 A1 | 7/2009 |
| WO | WO-2011052518 A1 | 5/2011 |

OTHER PUBLICATIONS

Japanese Office Action issued for corresponding Application No. JP 2012-540724, dispatch date Sep. 3, 2013 (with English translation).
International Search Report and Written Opinion, issued in PCT/JP2011/068850, mailed Nov. 22, 2011.

* cited by examiner

SEMICONDUCTOR CERAMIC AND RESISTIVE ELEMENT

This is a continuation of application Serial No. PCT/JP2011/068850, filed Aug. 22, 2011, the entire contents of which is incorporated herein by reference.

TECHNICAL FIELD

This invention relates to a semiconductor ceramic and a resistive element configured with the use of the semiconductor ceramic, and more particularly, relates to a resistive element advantageously for use as a thermistor element for suppressing an inrush current.

BACKGROUND ART

Resistive elements of interest to this invention include, for example, NTC thermistors. For example, Patent Document 1 discloses, as a composition constituting an element main body for a NTC thermistor for temperature compensation use or a thermistor for inrush current suppression (power thermistor), an oxide composition containing at least one of manganese, copper, calcium, cobalt, or nickel with borosilicate glass added thereto.

The thermistor materials which have a Mn—Co based spinel structure are widely used in conventional thermistors for temperature compensation or thermistors for inrush current suppression.

In general, circuits as shown in FIG. 4 are used for inrush current suppression. FIG. 4 shows, as a block diagram, an electrical device including a power thermistor for inrush current suppression.

Referring to FIG. 4, an electrical device 11 includes a load circuit 13 driven by an alternating-current power supply 12, and the alternating-current power supply 12 is adapted to supply power through a rectifier 14 to the load circuit 13. A power thermistor 16 for inrush current suppression is connected in series with a power supply line 15 for this power supply. In addition, a smoothing capacitor 17 is connected in parallel to the load circuit 13.

Conventionally, an NTC thermistor is often used as the power thermistor 16. The NTC thermistor exhibits, unlike common solid resistors, a high resistance from power-off immediately after power-on, and undergoes a decrease in resistance by self-heating after the power-on. Therefore, the NTC thermistor has the advantage of being able to reduce the power consumption, as compared with common solid resistors which undergo almost no change in resistance value depending on temperature changes.

To explain the operation of the circuit shown in FIG. 4 more specifically, (1) the inrush current generated by quickly charging the smoothing capacitor 17 in the case of applying power from the alternating-current power supply 12 is suppressed by the initial resistance R25 (resistance value at 25° C.) of the power thermistor 16 composed of the NTC thermistor; (2) after a steady current flows through the load circuit 13, the power thermistor 16 undergoes a decrease in resistance value by self-heating; and (3) the reduced resistance of the power thermistor 16 can reduce the power loss when the steady current flows, as compared with solid resistors, and as a result, the power consumption can be restrained.

Therefore, the increased difference between the standby (power-off) resistance value at room temperature and the resistance value obtained when the steady current flows (B constant increased) achieves a more beneficial inrush current suppression effect in regard to the power thermistor 16, and makes it possible to further restrain the power consumption in the steady state.

The power thermistor is widely used in power supply devices such as AC adapters. A rated current is constantly applied to the power thermistor in a steady state, and the temperature of the power thermistor thus reaches such a high temperature over 170° C., depending on the magnitude of the current. For example, it is due to the heat generation of the power thermistor that the whole of an AC adapter gets hot.

When the power thermistor reaches high temperatures, problems are caused such as a wiring substrate with the thermistor mounted undergoes a color change or releases an unusual odor due to the heating, or the increased temperature of the whole of the power supply device such as an AC adapter increases the load on other electronic components or causes failures. In addition, the power thermistor is inserted in series with a power-supply line, and the increased residual resistance in an on-state (a state of steady current flowing) thus not only increases the power consumption, but also causes the problem of fluctuation in steady current due to temperature fluctuation. Thus, resistive elements have been strongly desired which have lower residual resistance and low resistance temperature dependence in an on-state.

However, existing spinel thermistor materials as described in Patent Document 1 have difficulty in solving the problems mentioned above.

In general, insulators and semiconductors exhibit NTC (negative temperature coefficient) characteristics of resistance change with the increase in temperature, have a tendency to undergo a substantial change in resistance with respect to temperature as the resistivity is increased, and undergo a decrease in temperature dependence as the resistivity is decreased because of being closer to metals. More specifically, the B constant is increased as the resistivity is increased, whereas the B constant is decreased as the resistivity is decreased.

Therefore, the use of a high B-constant material can increase the difference in resistance between an off-state and an on-state, and high-resistivity materials are thus believed to be used favorably. However, the resistivity is excessively increased in that case, to make it impractically necessary to create an extremely thin element including an extremely large electrode in the case of creating a power thermistor with a resistance value slightly less than 10Ω. Therefore, existing power thermistors have no choice but to select, as thermistor materials, materials which have relatively low resistivity and the B constant on the order of 3000, and it is difficult to solve the problems mentioned above because the materials exhibit almost the same B constant in a temperature range on the order of −50° C. to 200° C.

Accordingly, a novel material is required which can, at the very least, satisfy two conditions of relatively low resistivity and high B constant, which are difficult to achieve a balance in order to solve the problems mentioned above.

PRIOR ART DOCUMENTS

Patent Documents

Patent Document 1: Japanese Patent Application Laid-Open No. 2001-102204

DISCLOSURE OF THE INVENTION

Problem to be Solved by the Invention

One object of this invention is to provide a resistive element which has excellent inrush current resistance and can suppress heat generation in a steady state, and a semiconductor ceramic which can be advantageously used to constituting the resistive element.

Means for Solving the Problem

This invention is first directed to a semiconductor ceramic. The semiconductor ceramic according to this invention is characterized in that a main constituent has a structure represented by a chemical formula of $R1_{1-x}R2_xBaMn_2O_6$, and x meets (1) $0.05 \le x \le 1.0$ when R1 comprises Nd and R2 comprises at least one of Sm, Eu and Gd;

(2) $0.05 \le x \le 0.8$ when R1 comprises Nd and R2 comprises at least one of Tb, Dy, Ho, Er, and Y;

(3) $0 \le x \le 0.4$ when R1 comprises at least one of Sm, Eu, and Gd and R2 comprises at least one of Tb, Dy, Ho, and Y; and (4) $0 \le x \le 1.0$ when R1 comprises at least one of Sm, Eu, and Gd and R2 comprises at least one of Sm, Eu, and Gd, which is not in R1.

This invention is also directed to a resistive element including: an element main body; and at least one pair of electrodes formed with at least a portion of the element main body interposed between the electrodes. The resistive element according to this invention is characterized in that the element main body comprises the semiconductor ceramic according to this invention.

The resistive element according to this invention is preferably used as a thermistor element for suppressing an inrush current.

In the resistive element according to this invention, preferably, the element main body forms the shape of a plate, and the electrodes are formed on respective principal surfaces of the plate-like element main body so as to be opposed to each other.

Advantageous Effect of the Invention

The semiconductor ceramic according to this invention can meet the two conditions of relatively low resistivity and high B constant. Therefore, this semiconductor ceramic can be used to constitute a resistive element preferred as a power thermistor, which has high inrush current resistance and inrush current suppression effect, and has reduced power consumption in a steady state, while suppressing heat generation from the resistive element.

This is assumed to be due to the following reason.

The semiconductor ceramic according to this invention has a structure with the main constituent represented by the chemical formula $R1_{1-x}R2_xBaMn_2O_6$. More specifically, the main constituent in the semiconductor ceramic according to this invention is an A-site aligned Mn compound in which a rare-earth element and barium are aligned at the A site in a perovskite structure. The A-site aligned Mn compound exhibits, as known conventionally, CTR (Critical Temperature Resistance) characteristics which undergo a sudden change in resistance at a specific temperature, that is it has a high B constant.

In addition, the composition range defined in this invention makes it possible to achieve a favorable balance between the heat generation and heat release of the element without decreasing the CTR characteristics in the case of applying an inrush current, inhibit element destruction while suppressing the inrush current, and further suppress the on resistance, thereby solving the heat generation problem of the element.

Thus, the use of the semiconductor ceramic according to this invention makes it possible to exhibit the high resistivity regarded as in a charge ordering insulator and function as an inrush current suppression element in a steady state (near room temperature), and when an inrush current is applied to cause the element generate heat, change from a charge ordering insulator to a metal state and undergo a sudden decrease in resistivity to apply a large inrush current, thereby making it possible to absorb inrush current, and further suppress the heat generation of the element.

BEST MODE FOR CARRYING OUT THE INVENTION

Figure 1:
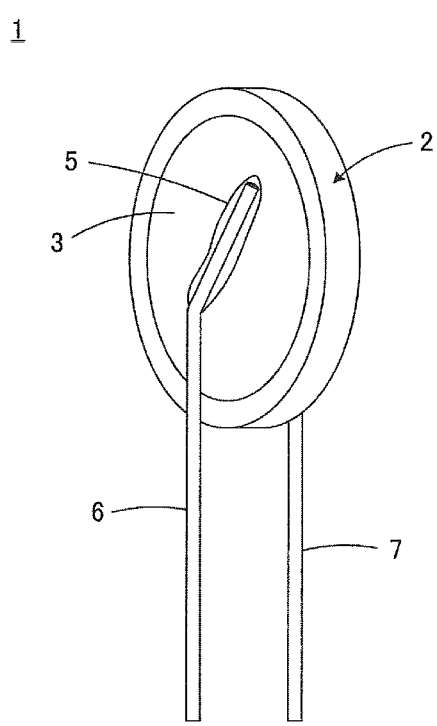
FIG. 1 is a perspective view illustrating the appearance of a resistive element 1 according to an embodiment of this invention.

A resistive element 1 according to an embodiment of this invention will be described with reference to FIG. 1.

The resistive element 1 includes a disk-shaped element main body 2 composed of a semiconductor ceramic, and a pair of electrodes formed respectively on mutually opposed principal surfaces of the element main body 2. In FIG. 1, only one electrode 3 is shown. The other electrode, not shown, is formed so as to be opposed to the electrode 3 shown. A lead 6 is connected to electrode 3 via, for example, a solder 5 shown in the figure, whereas a lead 7 is likewise connected via a solder to the other electrode, not shown.

The resistive element 1 shown in FIG. 1 is mounted on a wiring substrate, not shown, with the leads 6 and 7 interposed therebetween, and advantageously used as a thermistor element for suppressing an inrush current, that is, as a power thermistor.

It is to be noted that the element main body 2 is not limited to such a disk shape as shown, but can form any other plate shape.

The semiconductor ceramic constituting the element main body 2 in the resistive element 1 contains, as its main constituent, an A-site aligned Mn compound. More specifically, this semiconductor ceramic has a structure with the main constituent represented by the chemical formula $R1_{1-x}R2_xBaMn_2O_6$. In this formula, x is (1) $0.05 \le x \le 1.0$ when R1 comprises Nd and R2 comprises at least one of Sm, Eu and Gd;

(2) $0.05 \le x \le 0.8$ when R1 comprises Nd and R2 comprises at least one of Tb, Dy, Ho, Er, and Y;

(3) $0 \le x \le 0.4$ when R1 comprises at least one of Sm, Eu, and Gd and R2 comprises at least one of Tb, Dy, Ho, and Y; and (4) $0 \le x \le 1.0$ when R1 comprises at least one of Sm, Eu, and Gd and R2 comprises at least one of Sm, Eu, and Gd, which is not in R1.

In order to manufacture the element main body 2 included in the resistive element 1, the following respective steps are carried out: preparation of starting raw materials; calcination; forming; degreasing; main firing; and reoxidation, and in particular, in the main firing step, the oxygen partial pressure is preferably controlled to $1\times10^{-6}$ MPa to $5\times10^{-12}$ MPa. The inventor has found that this control generates oxygen defects at relatively low temperatures in the main firing step, and as a result, can achieve the alignment of R1/R2 with Ba at the A site efficiently in a relatively short period of time. In addition, it has been also found that the reoxidation treatment carried out subsequently also can take a shorter period of time.

Next, the electrodes 3 and the other electrode are formed by baking a conductive paste containing, for example, Ag as a conductive constituent onto predetermined surfaces of the element main body 2, thereby completing the resistive element 1.

This invention will be descried below more specifically with reference to Experimental Example.

Experimental Example

As starting raw materials, high-purity (3 N or more) barium carbonate ($BaCO_3$) and manganese oxide ($Mn_3O_4$) were prepared, and further prepared were neodymium hydroxide (Nd $(OH)_3$) as a compound containing a rare-earth element Nd, as well as oxides of other rare-earth elements, samarium oxide ($Sm_2O_3$), europium oxide ($Eu_2O_3$), gadolinium oxide ($Gd_2O_3$), terbium oxide ($Tb_4O_7$), holmium oxide ($Ho_2O_3$), dysprosium oxide ($Dy_2O_3$), erbium oxide ($Er_2O_3$) and yttrium oxide ($Y_2O_3$).

Next, these starting raw materials were weighed to have the compositions shown in Tables 1 to 3 after firing, and with the addition of pure water and a dispersant thereto, subjected to a grinding and mixing treatment for 24 hours with the use of PSZ balls of 2 mm in diameter.

Next, the slurry containing the starting raw materials, which was subjected to the grinding and mixing treatment, was dried, and subjected to granulation, and then calcination at a temperature of 800° C. for 2 hours in the atmosphere.

Next, the calcined powder obtained was, with the addition of pure water, a dispersant, and a binder thereto, subjected to a grinding treatment for 24 hours with the use of PSZ balls of 5 mm in diameter, and dried to obtain a raw material for pressing.

Thereafter, a pressing machine was used to prepare disk-shaped pressed single plates of 10 mm in diameter and 1 to 3 mm in thickness at a pressure of 2000 Kgf/cm². The multiple samples differing in thickness, such as 1 to 3 mm in thickness, was prepared herein, because the resistivity varies depending on the composition, and the thickness and the electrode area described later were changed to make adjustments for the element resistance on the order of 4 to 8Ω commonly used at room temperature.

Next, the pressed single plates were subjected to a degreasing treatment at a temperature of 450° C. for 2 hours in the atmosphere, and then to main firing at a temperature of 1300° C. for 12 hours in a $H_2/H_2O/N_2$ atmosphere. Then, a heat treatment for reoxidation was then carried out at a temperature of 600° C. for 24 hours in an oxygen atmosphere to obtain element main bodies.

Next, an Ag paste was applied onto both principal surfaces of the element main bodies, and subjected to a baking treatment at a temperature of 800° C. in the atmosphere to form electrodes, thereby providing resistive elements for each sample.

For the thus obtained resistive elements, the resistance temperature dependence was evaluated by a four-terminal method with the use of a resistance measuring device (Keithley 2430) and a temperature bath (from Despatch). The B constant as an indicator indicating how the resistance is changed with the change in temperature was calculated with the use of the following formula, from the resistance temperature dependence measured at every 10° C.

$$B\ Constant=\ln(R_1/R_2)/(1/T_1-1/T_2)$$

$R_1$ and $R_2$ are respectively resistance values [Ω] measured at temperatures [K] of $T_1$ and $T_2$.

Figure 2:
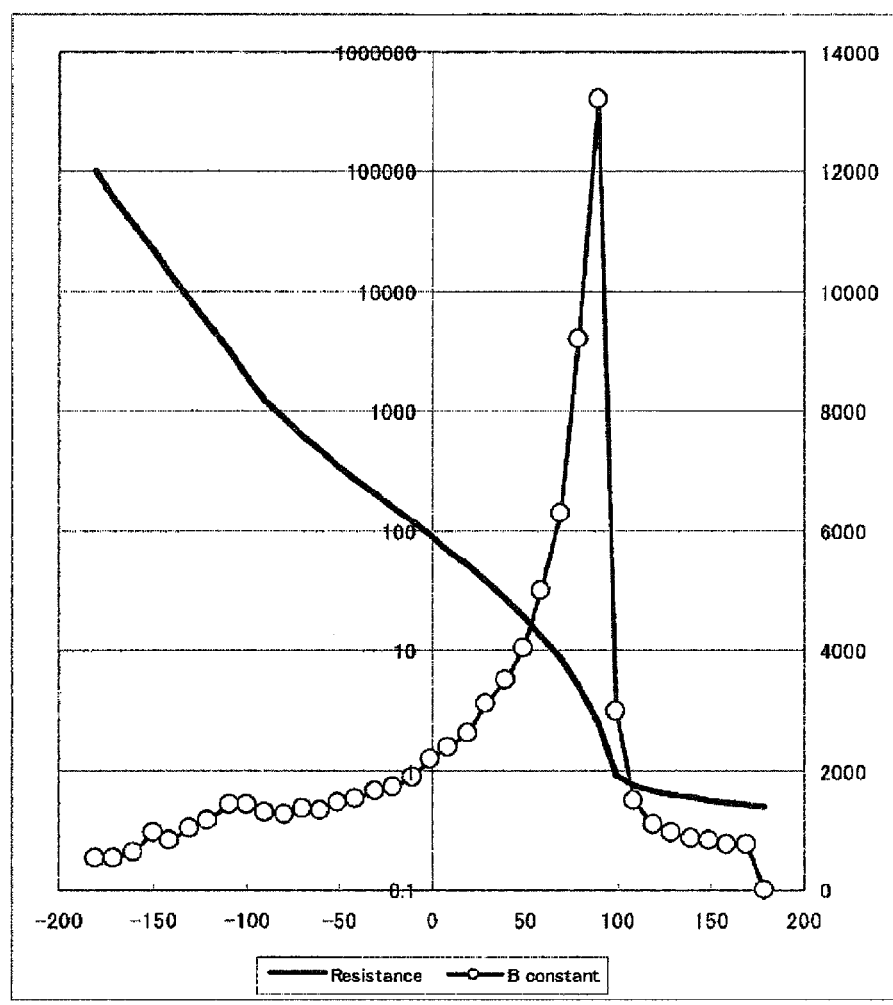
FIG. 2 is a diagram showing a resistance temperature dependence and a B constant for a semiconductor ceramic according to sample 16 obtained in Experimental Example.

On behalf of the samples obtained in this Experimental Example, FIG. 2 shows a resistance temperature dependence and B constant for sample 16. As shown in FIG. 2, the semiconductor ceramic according to this invention, as typified by sample 16, exhibits CTR characteristics suddenly decreased in resistance at a certain temperature. This is due to the fact that while the particular state of a charge ordering insulator has carriers frozen at not higher than the transition temperature, the charge ordering state is collapsed with the increase in temperature to allow the carriers to move around at once, thus exhibiting a rapid change in resistance.

Although not shown, it has been confirmed that the samples other than sample 16, which fall within the scope of this invention, also have substantially the same tendency as shown in FIG. 2.

Next, for each sample, the initial resistance was first measured at room temperature, and an inrush current resistance test was then carried out under the conditions of AC: 240 V, phase: 90°, and protective resistance: 1300Ω. In the inrush current resistance test, under the conditions mentioned above, an inrush current was applied to the sample five times for each load capacitance condition described below, the sample was left for 1 minute after the application, and the resistance was again measured to make a determination of "pass" in the case of the resistance within ±25% of the initial resistance, or make a determination of "fail" in the case of the resistance outside ±25% of the initial resistance. The load capacitance was gradually increased to 15 µF, 22 µF, 33 µF, 47 µF, 68 µF, 100 µF, 150 µF, 220 µF, and 300 µF, and the maximum load capacitance corresponding to the determination of pass was regarded as the maximum allowable load capacitance for an indicator of inrush current resistance. This maximum allowable load capacitance is shown in Tables 1 to 3. In this invention, a determination of pass was made in the case of the maximum allowable load capacitance of 150 µF or more, whereas a determination of fail was made in the other cases.

Furthermore, while a Type K thermocouple was attached to the element main bodies of the resistive elements according to each sample with Aron Ceramics (heat-resistance inorganic adhesive), a direct current of 2 A was applied to the resistive element at room temperature, and the element temperature in a steady state after waiting for a while was measured with the Type K thermocouple. This element temperature is shown in Tables 1 to 3. A determination of "pass" was made in the case of the measured element temperature of 150° C. or lower, whereas a determination of "fail" was made in the case of higher than 150° C.

The temperature of 150° C. was used as the criteria for the determination because, due to the fact that, in the case of making an evaluation of "NTPA78R0" thermistor from Murata Manufacturing Co., Ltd using a conventionally known Mn-based spinel material and exhibiting the same resistance of 8Ω at room temperature, the element temperature was 192° C. when a direct current of 2 A was applied at room temperature, the effect of solving the problem described previously is thus achieved adequately at 150° C. or lower, which is substantially lower than the element temperature.

TABLE 1

| Sample Number | R1 | R2 | x | Maximum Allowable Load Capacitance (μF) | Element Temperature (°C.) |
|---|---|---|---|---|---|
| * 1 | Nd | — | 0 | 100 | 123 |
| 2 | Nd | Sm | 0.05 | 220 | 125 |
| 3 | Nd | Sm | 0.1 | 220 | 132 |
| 4 | Nd | Sm | 0.5 | 220 | 146 |
| 5 | Nd | Sm | 0.8 | 300 | 132 |
| 6 | Nd | Sm | 0.95 | 220 | 135 |
| 7 | Nd | Sm | 1 | 150 | 142 |
| 8 | Nd | Eu | 0.05 | 220 | 122 |
| 9 | Nd | Eu | 0.1 | 220 | 123 |
| 10 | Nd | Eu | 0.5 | 220 | 123 |
| 11 | Nd | Eu | 0.8 | 300 | 135 |
| 12 | Nd | Eu | 0.95 | 220 | 136 |
| 13 | Nd | Eu | 1 | 150 | 136 |
| 14 | Nd | Gd | 0.05 | 220 | 130 |
| 15 | Nd | Gd | 0.1 | 220 | 132 |
| 16 | Nd | Gd | 0.5 | 220 | 132 |
| 17 | Nd | Gd | 0.8 | 300 | 134 |
| 18 | Nd | Gd | 0.95 | 220 | 133 |
| 19 | Nd | Gd | 1 | 150 | 136 |
| 20 | Nd | Tb | 0.05 | 220 | 125 |
| 21 | Nd | Tb | 0.1 | 300 | 125 |
| 22 | Nd | Tb | 0.5 | 220 | 126 |
| 23 | Nd | Tb | 0.8 | 300 | 135 |
| * 24 | Nd | Tb | 1 | 150 | 165 |
| 25 | Nd | Ho | 0.05 | 150 | 130 |
| 26 | Nd | Ho | 0.1 | 220 | 132 |
| 27 | Nd | Ho | 0.5 | 300 | 136 |
| 28 | Nd | Ho | 0.8 | 220 | 124 |
| * 29 | Nd | Ho | 1 | 150 | 169 |
| 30 | Nd | Dy | 0.05 | 150 | 129 |
| 31 | Nd | Dy | 0.1 | 220 | 131 |
| 32 | Nd | Dy | 0.5 | 300 | 133 |
| 33 | Nd | Dy | 0.8 | 300 | 129 |
| * 34 | Nd | Dy | 1 | 150 | 169 |
| 35 | Nd | Er | 0.05 | 220 | 126 |
| 36 | Nd | Er | 0.1 | 220 | 129 |
| 37 | Nd | Er | 0.5 | 220 | 131 |
| 38 | Nd | Er | 0.8 | 220 | 141 |
| * 39 | Nd | Er | 1 | 150 | 175 |
| 40 | Nd | Y | 0.05 | 300 | 128 |
| 41 | Nd | Y | 0.1 | 220 | 129 |
| 42 | Nd | Y | 0.5 | 220 | 131 |
| 43 | Nd | Y | 0.8 | 200 | 141 |
| * 44 | Nd | Y | 1 | 150 | 175 |

TABLE 2

| Sample Number | R1 | R2 | x | Maximum Allowable Load Capacitance (μF) | Element Temperature (°C.) |
|---|---|---|---|---|---|
| 45 | Sm | — | 0 | 150 | 142 |
| 46 | Sm | Eu | 0.05 | 150 | 132 |
| 47 | Sm | Eu | 0.3 | 150 | 135 |
| 48 | Sm | Eu | 0.5 | 150 | 135 |
| 49 | Sm | Eu | 0.8 | 150 | 146 |
| 50 | Sm | Eu | 0.95 | 150 | 145 |
| 51 | Sm | — | 0 | 150 | 142 |
| 52 | Sm | Gd | 0.05 | 220 | 130 |
| 53 | Sm | Gd | 0.3 | 150 | 132 |
| 54 | Sm | Gd | 0.5 | 150 | 135 |
| 55 | Sm | Gd | 0.8 | 150 | 139 |
| 56 | Sm | Gd | 0.95 | 150 | 142 |
| 57 | Eu | — | 0 | 150 | 136 |
| 58 | Eu | Gd | 0.05 | 220 | 135 |
| 59 | Eu | Gd | 0.3 | 150 | 139 |
| 60 | Eu | Gd | 0.5 | 150 | 136 |
| 61 | Eu | Gd | 0.8 | 150 | 146 |
| 62 | Eu | Gd | 0.95 | 150 | 146 |
| 63 | Sm | — | 0 | 150 | 142 |
| 64 | Sm | Tb | 0.05 | 150 | 133 |
| 65 | Sm | Tb | 0.1 | 150 | 136 |
| 66 | Sm | Tb | 0.4 | 150 | 139 |
| * 67 | Sm | Tb | 0.5 | 100 | 170 |
| 68 | Sm | — | 0 | 150 | 142 |
| 69 | Sm | Dy | 0.05 | 150 | 136 |
| 70 | Sm | Dy | 0.1 | 150 | 134 |
| 71 | Sm | Dy | 0.4 | 150 | 140 |
| * 72 | Sm | Dy | 0.5 | 100 | 177 |
| 73 | Sm | — | 0 | 150 | 142 |
| 74 | Sm | Ho | 0.05 | 150 | 135 |
| 75 | Sm | Ho | 0.1 | 150 | 136 |
| 76 | Sm | Ho | 0.4 | 150 | 140 |
| * 77 | Sm | Ho | 0.5 | 150 | 175 |
| 78 | Sm | — | 0 | 150 | 142 |
| 79 | Sm | Er | 0.05 | 150 | 141 |
| 80 | Sm | Er | 0.1 | 150 | 140 |
| 81 | Sm | Er | 0.4 | 150 | 142 |
| * 82 | Sm | Er | 0.5 | 150 | 165 |
| 83 | Sm | — | 0 | 150 | 142 |
| 84 | Sm | Y | 0.05 | 150 | 140 |
| 85 | Sm | Y | 0.1 | 150 | 139 |
| 86 | Sm | Y | 0.4 | 150 | 140 |
| * 87 | Sm | Y | 0.5 | 150 | 174 |

TABLE 3

| Sample Number | R1 | R2 | x | Maximum Allowable Load Capacitance (μF) | Element Temperature (°C.) |
|---|---|---|---|---|---|
| 88 | Eu | — | 0 | 150 | 136 |
| 89 | Eu | Tb | 0.05 | 150 | 138 |
| 90 | Eu | Tb | 0.1 | 150 | 140 |
| 91 | Eu | Tb | 0.4 | 150 | 142 |
| * 92 | Eu | Tb | 0.5 | 150 | 169 |
| 93 | Eu | — | 0 | 150 | 136 |
| 94 | Eu | Ho | 0.05 | 150 | 140 |
| 95 | Eu | Ho | 0.1 | 150 | 141 |
| 96 | Eu | Ho | 0.4 | 150 | 139 |
| * 97 | Eu | Ho | 0.5 | 150 | 168 |
| 98 | Eu | — | 0 | 150 | 136 |
| 99 | Eu | Dy | 0.05 | 150 | 139 |
| 100 | Eu | Dy | 0.1 | 150 | 141 |
| 101 | Eu | Dy | 0.4 | 150 | 140 |
| * 102 | Eu | Dy | 0.5 | 150 | 178 |
| 103 | Eu | — | 0 | 150 | 136 |
| 104 | Eu | Er | 0.05 | 150 | 141 |
| 105 | Eu | Er | 0.1 | 150 | 144 |
| 106 | Eu | Er | 0.4 | 150 | 142 |
| * 107 | Eu | Er | 0.5 | 100 | 177 |
| 108 | Eu | — | 0 | 150 | 136 |
| 109 | Eu | Y | 0.05 | 150 | 144 |
| 110 | Eu | Y | 0.1 | 150 | 145 |
| 111 | Eu | Y | 0.4 | 150 | 139 |
| * 112 | Eu | Y | 0.5 | 100 | 180 |
| 113 | Gd | — | 0 | 150 | 136 |
| 114 | Gd | Tb | 0.05 | 150 | 138 |
| 115 | Gd | Tb | 0.1 | 150 | 140 |
| 116 | Gd | Tb | 0.4 | 150 | 146 |
| * 117 | Gd | Tb | 0.5 | 100 | 181 |
| 118 | Gd | — | 0 | 150 | 136 |
| 119 | Gd | Dy | 0.05 | 150 | 141 |
| 120 | Gd | Dy | 0.1 | 150 | 142 |
| 121 | Gd | Dy | 0.4 | 150 | 144 |
| * 122 | Gd | Dy | 0.5 | 100 | 185 |
| 123 | Gd | — | 0 | 150 | 136 |
| 124 | Gd | Ho | 0.05 | 150 | 141 |
| 125 | Gd | Ho | 0.1 | 150 | 145 |
| 126 | Gd | Ho | 0.4 | 150 | 140 |
| * 127 | Gd | Ho | 0.5 | 100 | 177 |
| 128 | Gd | — | 0 | 150 | 136 |

TABLE 3-continued

| Sample Number | $R1_{1-x}R2_xBaMn_2O_6$ R1 | R2 | x | Maximum Allowable Load Capacitance (μF) | Element Temperature (°C) |
|---|---|---|---|---|---|
| 129 | Gd | Er | 0.05 | 150 | 135 |
| 130 | Gd | Er | 0.1 | 150 | 141 |
| 131 | Gd | Er | 0.4 | 150 | 140 |
| *132 | Gd | Er | 0.5 | 100 | 174 |
| 133 | Gd | — | 0 | 150 | 136 |
| 134 | Gd | Y | 0.05 | 150 | 138 |
| 135 | Gd | Y | 0.1 | 150 | 141 |
| 136 | Gd | Y | 0.4 | 150 | 140 |
| *137 | Gd | Y | 0.5 | 100 | 169 |

In Tables 1 to 3, the samples assigned an * fall outside the scope of this invention.

Samples 1 to 19 shown in Table 1 provide, on the composition of the semiconductor ceramic according to this invention, a basis for x which meets $0.05 \leq x \leq 1.0$ when the main constituent is represented by the chemical formula $R1_{1-x}R2_xBaMn_2O_6$ where R1 comprises Nd and R2 comprises at least one of Sm, Eu and Gd. Sample 1 with x=0 outside the scope of this invention, has a maximum allowable load capacitance less than 150 μF.

Samples 20 to 44 shown in Table 1 provide, on the composition of the semiconductor ceramic according to this invention, a basis for $0.05 \leq x \leq 0.8$ when the main constituent is represented by the chemical formula $R1_{1-x}R2_xBaMn_2O_6$ where R1 comprises Nd and R2 comprises at least one of Tb, Dy, Ho, Er, and Y. Samples 24, 29, 34, 39, and 44 with x=1 outside the scope of this invention have an element temperature which is higher than 150° C. when a direct current of 2 A is applied.

Samples 45 to 62 shown in Table 2 provide, on the composition of the semiconductor ceramic according to this invention, a basis for $0 \leq x \leq 1.0$ when the main constituent is represented by the chemical formula $R1_{1-x}R2_xBaMn_2O_6$ where R1 comprises at least one of Sm, Eu, and Gd and R2 comprises at least one of Sm, Eu, and Gd.

Samples 63 to 87 shown in Table 2 and samples 88 to 137 shown in Table 3 provide, on the composition of the semiconductor ceramic according to this invention, a basis for $0 \leq x \leq 0.4$ when the main constituent is represented by the chemical formula $R1_{1-x}R2_xBaMn_2O_6$ where R1 comprises at least one of Sm, Eu, and Gd and R2 comprises at least one of Tb, Dy, Ho, and Y. Samples 67, 72, 77, 82, 87, 92, 97, 102, 107, 112, 117, 122, 127, 132, and 137 with x=0.5 outside the scope of this invention have an element temperature which is higher than 150° C. when a direct current of 2 A is applied. Above all, samples 67, 72, 107, 112, 117, 122, 127, 132, and 137 further have the maximum allowable load capacitance less than 150 μF.

It is to be noted that samples 45, 51, 63, 68, 73, 78, and 83 are assigned sample numbers which differ from each other for the sake of convenience, but actually refer to the same sample. In addition, samples 57, 88, 93, 98, 103, and 108 also refer to the same sample. Likewise, samples 113, 118, 123, 128, and 133 also refer to the same sample.

As is clear from Tables 1 to 3, the resistive element configured with the use of the semiconductor ceramic which has a composition within the scope of this invention makes it possible to suppress the heat generation temperature of the element to 150° C. or lower when a direct current of 2 A is applied, with the maximum allowable load capacitance of 150 μF or more. Thus, the resistive element makes it possible to suppress the heat generation of the element in an on-state to 150° C. or lower while having inrush current resistance either equaling or surpassing those of existing Mn-based spinel thermistors, and makes it possible to reduce the harmful effect caused by the heat generation of the element in an on-state, which has been problematic conventionally.

Figure 3:
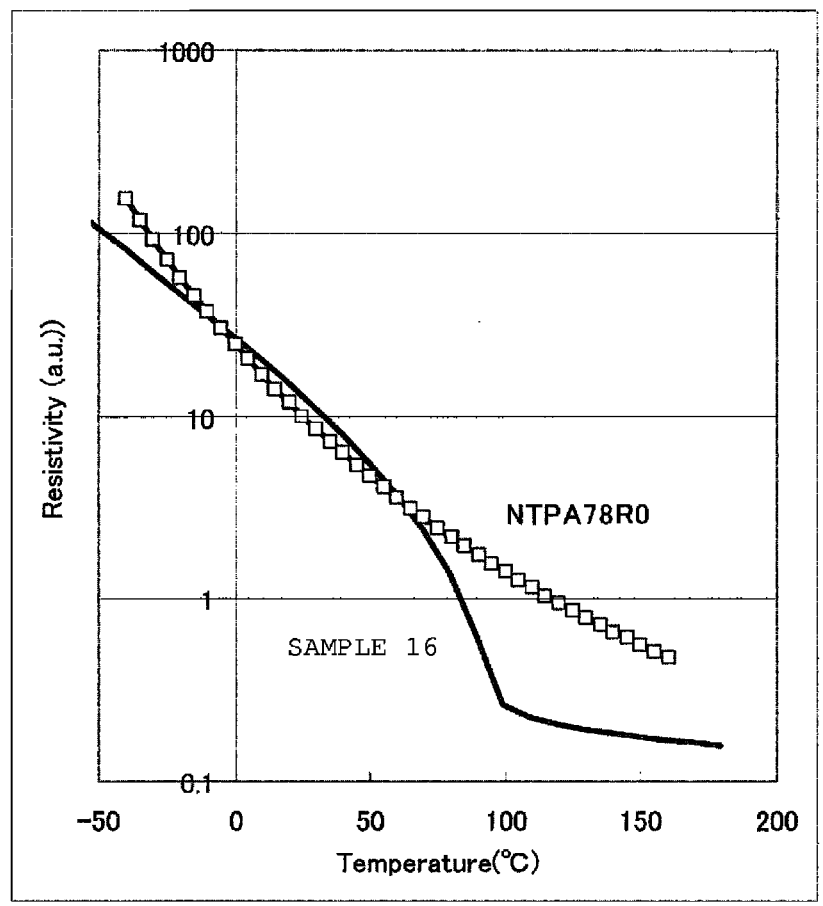
FIG. 3 is a diagram showing a comparison between a resistance temperature dependence for the semiconductor ceramic according to sample 16 obtained in the Experimental Example and a resistance temperature dependence for a Mn based spinel material for use in a conventional thermistor.
Figure 4:
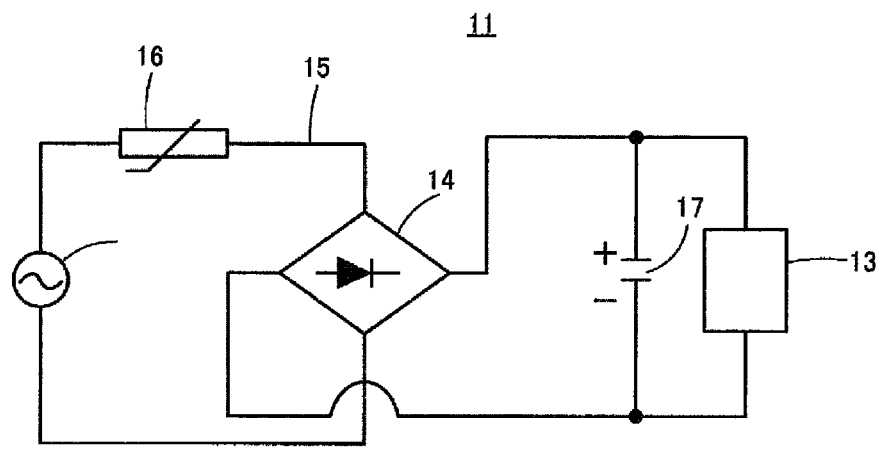
FIG. 4 is a block diagram of an electrical device 11 including a power thermistor 16 for inrush current suppression, which has been used conventionally.

As described above, the reasons of succeeding in solving the problem of the existing materials include the resistance temperature dependence of the semiconductor ceramic material which has a composition within the scope of this invention. FIG. 3 is a diagram showing a comparison between the resistance temperature dependence for the semiconductor ceramic according to sample 16 obtained in this Experimental Example and a resistance temperature dependence for a Mn based spinel material for use in the "NTPA78R0" thermistor from Murata Manufacturing Co., Ltd.

As can be seen from FIG. 3, while the "NTPA78R0" and sample 16 are almost equal in resistance at room temperature, with the increase in temperature, the "NTPA78R0" undergoes merely gradual decrease in resistance whereas sample 16 exhibits the distinctive characteristics of the resistance being suddenly decreased at a certain temperature to reduce the resistance temperature dependence. While the two samples are different in composition from each other, and thus also different from each other in terms of thermal conductivity, etc., there is not substantial differences therein because the samples are both oxides. Therefore, as long as the element main bodies are equal in shape (volume) to each other, the difference between the two in FIG. 3 refers to a difference in resistance temperature dependence. Accordingly, it is considered that the semiconductor ceramic which has a composition within the scope of this invention has succeeded in suppressing the heat generation without excessively increasing the temperature, with a balance between the temperature of the sudden decrease in resistance and the heat generation, as shown in FIG. 3. Therefore, the semiconductor ceramic not only suppresses the temperature, but also suppresses fluctuation in resistance (current) due to fluctuation in temperature, thereby making it possible to solve the problem of the existing materials.

DESCRIPTION OF REFERENCE SYMBOLS 1 resistive element
2 element main body
3 electrode

The invention claimed is:

1. A semiconductor ceramic comprising a main constituent having a structure represented by the chemical formula of $R1_{1-x}R2_xBaMn_2O_6$ in which $0.05 \leq x \leq 1.0$, R1 comprises Nd, and R2 comprises at least one member of the group of Sm, Eu and Gd.

2. A semiconductor ceramic comprising a main constituent having a structure represented by the chemical formula of $R1_{1-x}R2_xBaMn_2O_6$ in which $0.05 \leq x \leq 0.8$, R1 comprises Nd and R2 comprises at least one member of the group of Tb, Dy, Ho, Er, and Y.

3. A resistive element comprising:
a pair of electrodes, and an element main body interposed between the electrodes,
wherein the element main body comprises the semiconductor ceramic according to claim 1.

4. A resistive element comprising:
a pair of electrodes, and an element main body interposed between the electrodes, wherein the element main body comprises the semiconductor ceramic according to claim 2.

\* \* \* \* \*